(12) United States Patent
Meyer et al.

(10) Patent No.: US 10,050,423 B1
(45) Date of Patent: Aug. 14, 2018

(54) CABLE-RETENTION DEVICE ASSEMBLY

(71) Applicant: Microsoft Technology Licensing, LLC, Redmond, WA (US)

(72) Inventors: John Charles Meyer, Redmond, WA (US); Srinivas Reddy Nagampet, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/426,866

(22) Filed: Feb. 7, 2017

(51) Int. Cl.
*H02G 3/04* (2006.01)
*G06F 1/18* (2006.01)
(Continued)

(52) U.S. Cl.
CPC ............. *H02G 3/04* (2013.01); *G06F 1/1601* (2013.01); *G06F 1/18* (2013.01); *H05K 5/0247* (2013.01);
(Continued)

(58) Field of Classification Search
CPC .. H02G 3/04; H02G 3/22; H02G 3/06; H02G 3/0625; G06F 1/1601; G06F 1/18;
(Continued)

(56) References Cited

U.S. PATENT DOCUMENTS 2,074,133 A   3/1937 Matthias
3,980,555 A   9/1976 Freissle
(Continued)

FOREIGN PATENT DOCUMENTS

CN   1822755 A     8/2006
DE   10245564 A1   4/2004
(Continued)

OTHER PUBLICATIONS

"Consider Adhesive De-Bonding: Stronger Adhesives are Not Always Better!", http://www.permabond.com/2014/09/11/adhesive-debonding-stronger-adhesives/, Published on: Sep. 11, 2014, 6 pages.
(Continued)

*Primary Examiner* — Dimary Lopez Cruz
*Assistant Examiner* — Abhishek Rathod
(74) *Attorney, Agent, or Firm* — Alleman Hall Creasman & Tuttle LLP

(57) ABSTRACT

A cable-retention device assembly includes a first assembly portion and a second assembly portion. The first and second assembly portions include a platform and a plurality of assembly joints. Each assembly joint includes a nose forming a terminal end, first and second interfacing sides extending from the platform to the nose, and a tunnel running through the assembly joint from the first interfacing side to the second interfacing side. Assembly joints of the first assembly portion are sized and shaped to cooperatively interface with assembly joints of the second assembly portion, such that tunnels of each plurality of assembly joints collectively define a cable-routing channel when the first and second assembly portions are mated. A cable is routable through the cable-routing channel to prevent separation between the first and second assembly portions.

18 Claims, 7 Drawing Sheets

(51) Int. Cl.
*H05K 5/02* (2006.01)
*G06F 1/16* (2006.01)
*H02G 3/22* (2006.01)
*H02G 3/06* (2006.01)
*H01R 13/58* (2006.01)

(52) U.S. Cl.
CPC ......... *H01R 13/582* (2013.01); *H02G 3/0625* (2013.01); *H02G 3/22* (2013.01)

(58) Field of Classification Search
CPC .............. H05K 5/0247; H01R 13/5816; H01R 13/582; H01R 13/5825
See application file for complete search history.

(56) References Cited

U.S. PATENT DOCUMENTS

| | | | | |
|---|---|---|---|---|
| 4,300,695 | A * | 11/1981 | Hsu | B65D 11/1833 220/4.34 |
| 5,566,048 | A * | 10/1996 | Esterberg | G06F 1/1616 16/307 |
| 5,822,030 | A | 10/1998 | Uchiyama | |
| 5,990,420 | A * | 11/1999 | Alexander | H02G 3/22 174/135 |
| 6,223,393 | B1 * | 5/2001 | Knopf | G06F 1/1618 16/366 |
| 6,227,502 | B1 * | 5/2001 | Derman | F16L 3/2235 248/68.1 |
| 6,893,295 | B1 * | 5/2005 | Lloyd | H01R 12/772 439/607.05 |
| 7,484,698 | B2 * | 2/2009 | Budagher | F16L 3/11 174/40 R |
| 7,549,881 | B2 * | 6/2009 | Cho | G02F 1/133604 439/235 |
| 8,426,733 | B1 * | 4/2013 | Cunningham | H02G 3/32 174/112 |
| 9,537,526 | B2 * | 1/2017 | Wilson | H04B 1/3888 |
| 2004/0085738 | A1 | 5/2004 | Barth et al. | |
| 2006/0237455 | A1 * | 10/2006 | Vargas | B65D 7/24 220/4.34 |
| 2007/0053144 | A1 * | 3/2007 | Nakatani | G06F 1/1616 361/679.21 |
| 2009/0134057 | A1 * | 5/2009 | Hidalgo Vargas | B65D 11/1833 206/600 |
| 2010/0238621 | A1 * | 9/2010 | Tracy | B29C 45/14639 361/679.27 |
| 2011/0048792 | A1 * | 3/2011 | Masaka | G03G 21/1652 174/480 |
| 2011/0134385 | A1 | 6/2011 | Farah | |
| 2011/0155448 | A1 * | 6/2011 | Saito | G06F 1/1616 174/520 |
| 2012/0115976 | A1 | 5/2012 | Igarashi et al. | |
| 2012/0263956 | A1 | 10/2012 | Watanabe et al. | |
| 2014/0102145 | A1 | 4/2014 | Teck | |
| 2014/0152890 | A1 | 6/2014 | Rayner | |
| 2014/0153211 | A1 * | 6/2014 | Malek | H01Q 1/243 361/809 |
| 2014/0177156 | A1 | 6/2014 | Cheng et al. | |
| 2014/0272332 | A1 | 9/2014 | Reineman et al. | |
| 2014/0287299 | A1 | 9/2014 | Krogdahl | |
| 2015/0077909 | A1 | 3/2015 | Filiz et al. | |
| 2015/0144394 | A1 * | 5/2015 | Webb | H02G 1/14 174/658 |
| 2016/0091932 | A1 | 3/2016 | Dighde et al. | |

FOREIGN PATENT DOCUMENTS

| | | |
|---|---|---|
| WO | 2001019937 A1 | 3/2001 |
| WO | 2011119828 A1 | 9/2011 |

OTHER PUBLICATIONS

"International Search Report and Written Opinion Issued in PCT Application No. PCT/US2018/016055", dated May 8, 2018, 14 Pages.

* cited by examiner

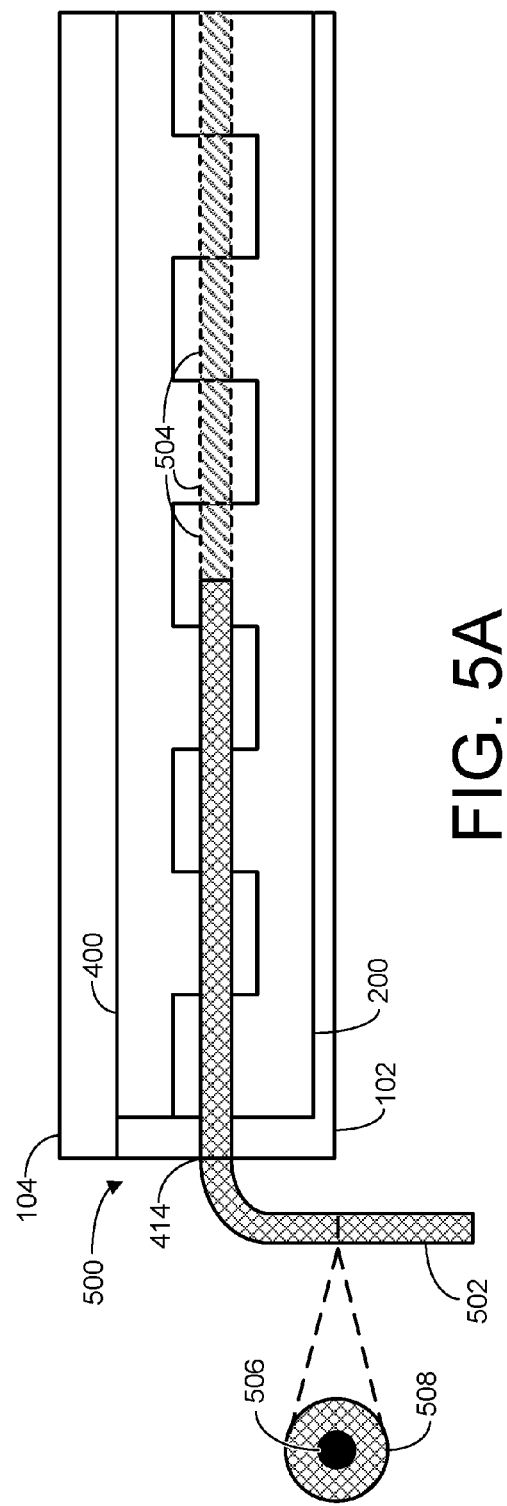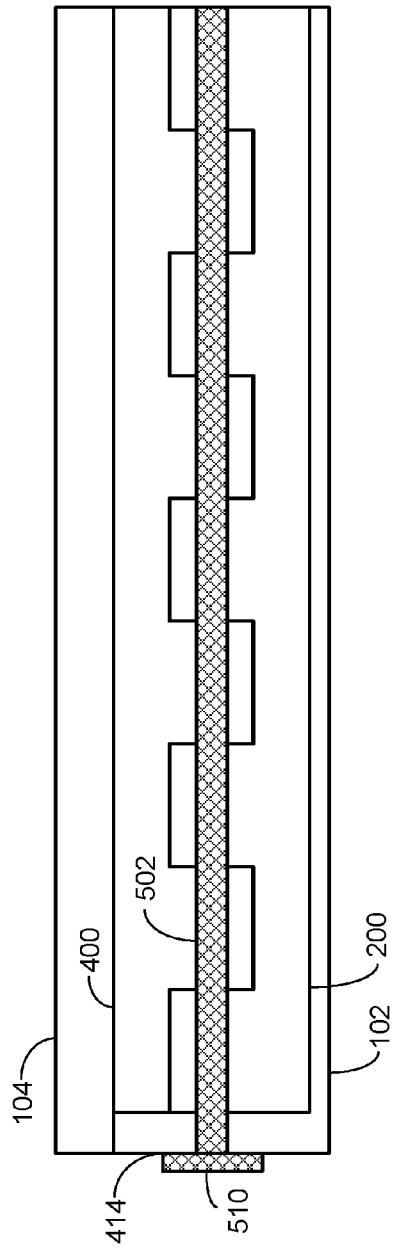

CABLE-RETENTION DEVICE ASSEMBLY

BACKGROUND

Computing devices often include a computing display and a computing device housing holding one or more processing components. The computing display is frequently affixed to the computing device housing via adhesive. Maintenance or repair of the computing device often requires removal of the computing display from the computing device housing.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A cable-retention device assembly includes a first assembly portion and a second assembly portion. The first and second assembly portions include a platform and a plurality of assembly joints. Each assembly joint includes a nose forming a terminal end of the assembly joint, first and second interfacing sides extending from the platform to the nose, and a tunnel running through the assembly joint from the first interfacing side to the second interfacing side. Assembly joints of the first assembly portion are sized and shaped to cooperatively interface with assembly joints of the second assembly portion, such that tunnels of each plurality of assembly joints collectively define a cable-routing channel when the first and second assembly portions are mated. A cable is routable through the cable-routing channel to prevent separation between the first and second assembly portions.

BRIEF DESCRIPTION OF THE DRAWINGS

FIGS. 5A and 5B schematically show routing of a cable into a cable-retention device assembly.

DETAILED DESCRIPTION

Manufacturers often use adhesive to affix computing displays to the underlying device housings. This can ensure that the attachment between the computing display and the device housing is suitably secure without adding unnecessary bulk to the device as a whole. However, adhesive can make it difficult or even impossible to remove the computing display from the device housing without damaging the computing device. This can make maintenance or repair of the computing device prohibitively complicated and time consuming. Other methods of affixing a display to a housing are also frequently used, though such alternative solutions have their own respective drawbacks, and may add unnecessary bulk to the computing device, fail to adequately secure the display to the housing, prevent efficient disassembly of the computing device, etc.

Accordingly, the present disclosure describes a cable-retention device assembly that allows a computing display to be securely though releasably affixed to a computing device housing. The device assembly includes first and second assembly portions, each assembly portion including a plurality of assembly joints. The assembly joints of each assembly portion are sized and shaped to cooperatively interface, thereby allowing the first and second assembly portions to be mated together. Each assembly joint defines a tunnel, and tunnels of adjacent assembly joints collectively define a cable-routing channel when the two assembly portions are mated. A cable is routable through the cable-routing channel to prevent separation of the two assembly portions. Should separation of the two assembly portions be required, the cable can be removed from the cable-routing channel, thereby allowing the computing device to be disassembled. Affixing computing device components in this manner facilitates and simplifies disassembly of the computing device, enabling device owners and technicians to more easily perform maintenance and repairs on the computing device.

The cable-retention device assembly described herein is generally described as affixing a computing display to a computing device housing. However, it will be understood that similar device assemblies may be used to releasably affix virtually any pair of objects having any suitable form factors, including objects that are not components of a computing device. Similarly, while this disclosure uses flexible cables as examples, virtually any structural member that is routable through a cable-routing channel may be used (e.g., inflexible rods). The term "cable" is meant to refer to any such structural member.

Figure 1:
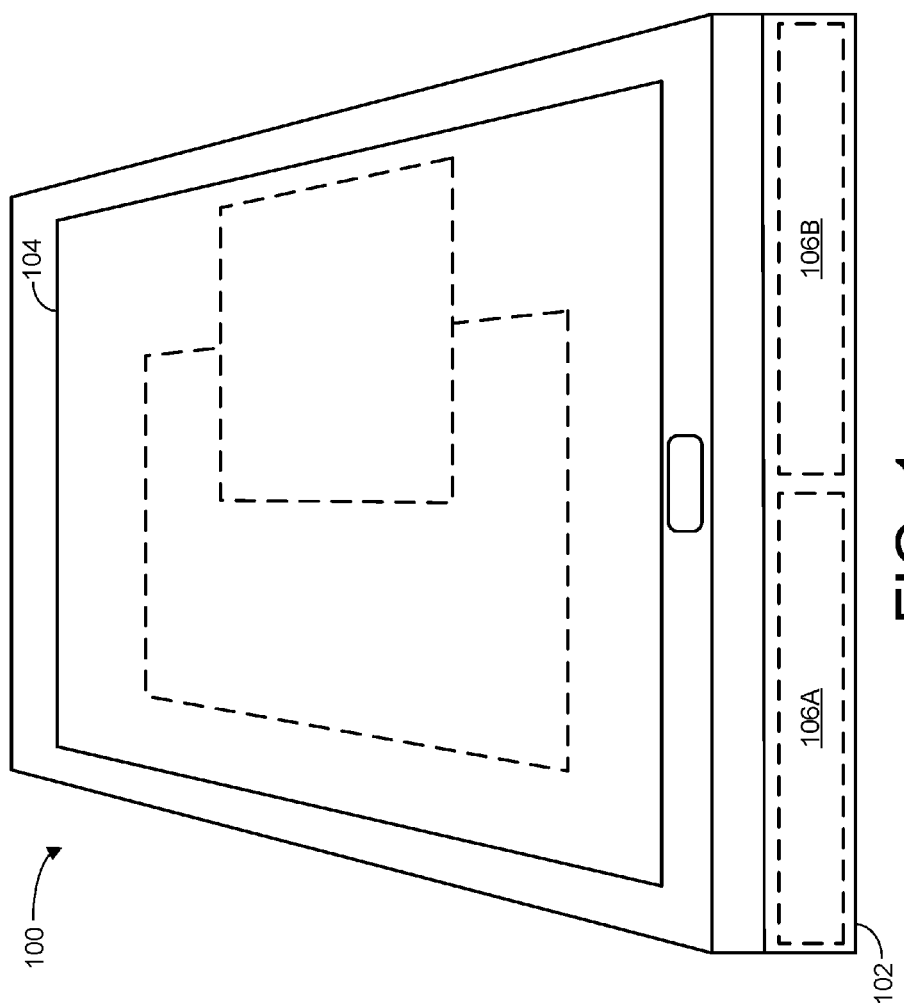
FIG. 1 schematically shows an example computing device.

FIG. 1 schematically shows an example computing device 100 including a computing device housing 102 and a computing display 104. Computing device housing 102 may include a variety of computer processing components, including schematically-illustrated components 106A and 106B. "Computer processing components" may describe virtually any hardware components of a computing device, and may include one or more logic machines, storage machines, communications interfaces, etc. A computing device as described herein may incorporate any suitable type of computing display, having any size and shape and incorporating any suitable display technologies. As is the case with computing device 100, computer processing components are frequently disposed beneath the computing display, requiring removal of the computing display in order to access, modify, or replace the computer processing components, and/or to access, modify, or replace components of the display itself. It is to be understood that this disclosure refers to the computing display as a single entity, but in practice, the computing display may include several discrete components (e.g., backlight, display matrix, cover glass, etc.). As such, reference to a computing display should be interpreted as being directed to some to all of the computing display (e.g., only the cover glass or the cover glass and the display electronics).

Computing device 100 is provided as an example, and cable-retention device assemblies as described herein may be used with a variety of computing devices having any suitable form factor. For example, a cable-retention device assembly may be used with laptop computers, desktop computers, mobile phones, tablets, wearable devices, displays, televisions, etc.

As indicated above, removal of a computing display from a computing device housing can be difficult and time consuming when the display is affixed to the housing with adhesive, and other methods of attaching a display to a housing may have their own respective drawbacks. Accordingly, each of the computing device housing and computing display may be attached to and/or otherwise incorporate an assembly portion including a plurality of assembly joints.

Figure 2:
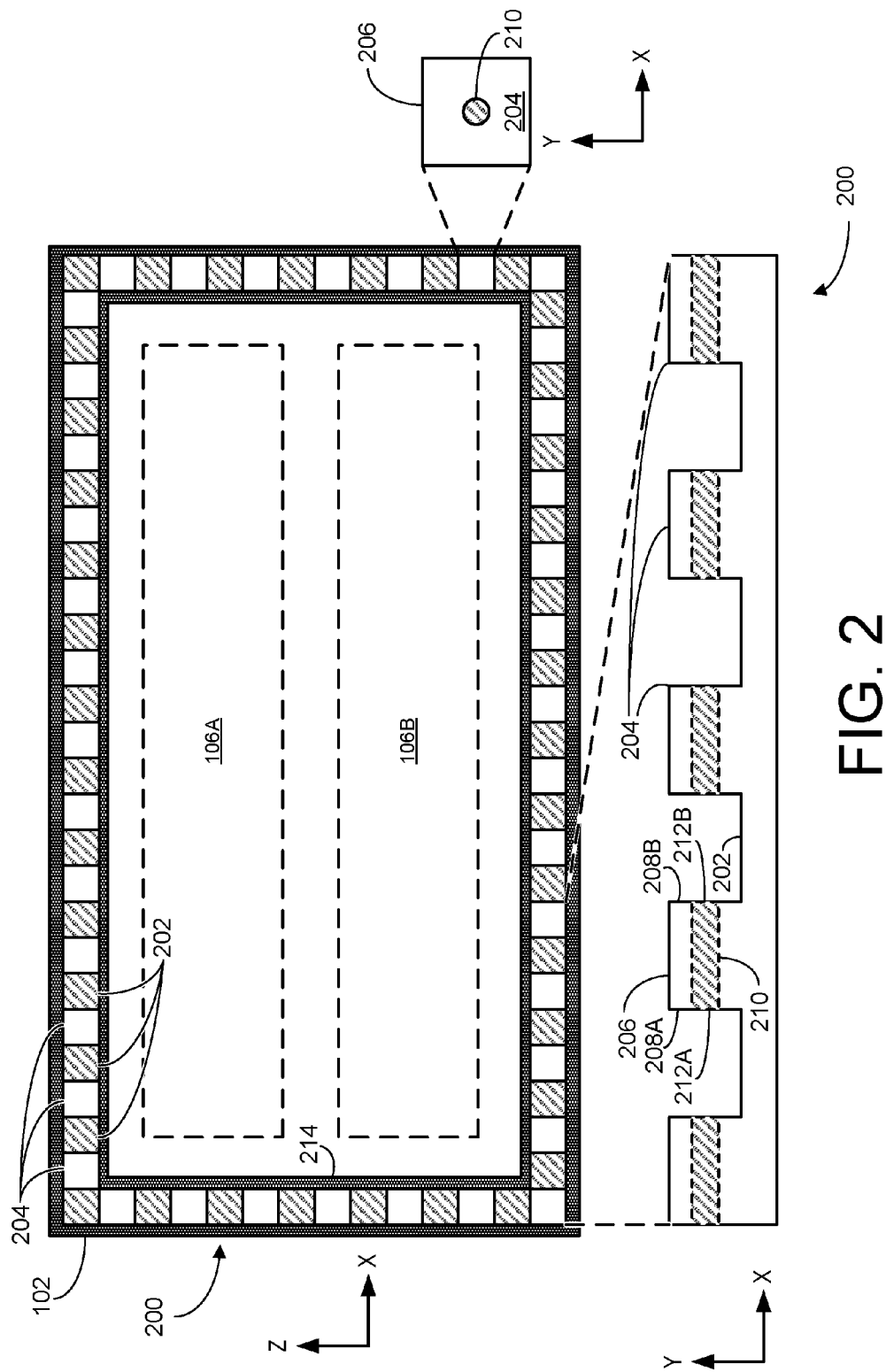
FIG. 2 schematically shows an example first assembly portion including a plurality of assembly joints.

Such an assembly portion is schematically illustrated in FIG. 2, which shows computing device housing 102 of computing device 100 without computing display 102. As shown, computing device housing 102 incorporates a first assembly portion 200. Assembly portion 200 includes a platform 202 and a plurality of assembly joints 204 extending from the platform. Each individual assembly joint includes a nose 206 forming a terminal end of the assembly joint. Each of the assembly joints also include first and second interfacing sides 208A and 208B extending from platform 202 to nose 206. As will be described in more detail below, assembly joints of the first assembly portion are sized and shaped to cooperatively interface with assembly joints of a second assembly portion, such that an interfacing side of an assembly joint contacts an interfacing side of a different assembly joint from the other assembly portion when the two assembly portions are mated. Additionally, each assembly joint defines a tunnel 210 running through the assembly joint from the first interfacing side to the second interfacing side, the first and second interfacing sides defining openings 212A and 212B of the tunnel.

Assembly joints may have a variety of shapes and sizes. For example, in FIG. 2, the first and second interfacing sides of each assembly joint are parallel to one another and perpendicular to the platform. Further, the nose of each assembly joint is perpendicular to the first and second assembly joints and parallel to the platform. The nose of each assembly joint has four sides, and each corner of the nose defines a right angle. Accordingly, the assembly joints pictured in FIG. 2 are generally cuboid-shaped.

Figure 3:
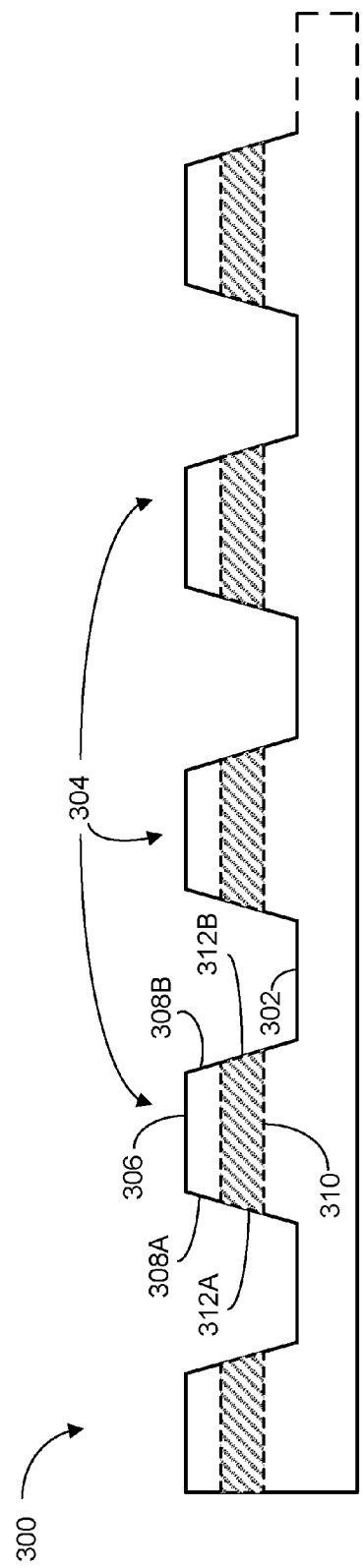
FIG. 3 schematically shows another example of a first assembly portion including a plurality of assembly joints.

However, assembly joints having other shapes may be used. As an example, FIG. 3 shows another example of a first assembly portion 300. As with first assembly portion 200, first assembly portion 300 includes a platform 302 and a plurality of assembly joints 304 extending from the platform. Each assembly joint includes a nose 306, first and second interfacing sides 308A and 308B running from the platform to the nose, and a tunnel 310 with tunnel openings 312A and 312B. However, in contrast to assembly joints 204, the first and second interfacing sides of each assembly joint 304 are angled such that the assembly joint tapers from the platform to the nose (i.e., the assembly joint nose is smaller than the assembly joint base). It will be understood that a second assembly portion may be complementarily configured for mating to first assembly portion 300.

Assembly joints may have any variety of complementary sizes and shapes not explicitly described herein. In general, the negative space between assembly joints of a first assembly portion are sized and shaped to receive the assembly joints of the second assembly portion. While the illustrated examples show the assembly joints of both assembly portions being substantially the same size and shape, this is not required. As such, assembly joints may assume a variety of suitable configurations, including triangular, pyramidal, trapezoidal, rhomboidal, etc. Assembly joints may also have any suitable size, and a single assembly portion may include any number of individual assembly joints.

The size and dimensions of the tunnel of each assembly joint can vary from implementation to implementation. In general, the smallest diameter of the tunnel will be slightly larger than the largest diameter of the cable inserted into the tunnel. As will be described below, this will allow the cable to be routed through the cable-routing channel without undue difficulty, while also providing sufficient friction to prevent the cable from being inadvertently removed. In some cases, the tunnel of each assembly joint may be lubricated with a suitable lubricating agent, facilitating both insertion and removal of the cable. Insertion and removal of the cable may also be facilitated by varying the internal dimensions of the tunnel. For example, the tunnel may be tapered and/or chamfered, such that each tunnel opening is wider than the interior of the tunnel. This may make it easier to insert the cable into the tunnel without compromising the friction required to hold the device assembly together. In some implementations, tunnels from one assembly portion may be slightly offset relative to tunnels from the other assembly portion in a manner that provides a straight path from tunnel to tunnel, but which allows the tunnels to be slightly oversized for easier cable insertion and removal.

Returning to FIG. 2, the assembly portion 200 is located in a recess 214 running along each edge of the computing device housing. This may reduce the overall thickness of the computing device, and help prevent water, dust, and/or other contaminants from entering the device housing, as contaminants entering the device will need to traverse the recess before reaching sensitive computer processing components. The recess may additionally include a variety of waterproofing measures, such as rubber gaskets or redirection channels, for example. Inserting the assembly portion into a recess may additionally improve the visual appearance of the computing device when assembled, as the user will see the edge of the computing device housing rather than a number of interlocking assembly joints. The recess is shown as being oversized relative to the assembly portion, such that there appears to be a gap between the edge of the assembly portion and the edge of the device housing. It will be understood that this is done as a visual aid in order to ensure that the recess is clearly visible in the drawing, and will typically not be the case in a physical device. Further, in some implementations, the computing device portion need not include a recess at all, and the first assembly portion may be affixed directly to an upper surface of the computing device housing. For example, in implementations in which water or dust resistance is not required, the assembly portion need not be located in a recess.

In FIG. 2, the first assembly portion is shown running along all four edges of the computing device housing. However, in other implementations, this need not be the case. In general, the platform and assembly joints will run along one or more edges of the computing device housing. In the event that one or more sides of the computing device housing do not include assembly joints, those sides optionally may be affixed to the computing display using another suitable attachment technique, such as slide joints, screws, bolts, rivets, clamps, adhesive, etc. For example, when adhesive is used to adhere one or more sides of the computing display to the device housing, a "peeling" action may be used to separate the two, and it may be easier to initiate such a peeling action when one or more other sides of the computing display are affixed to the device housing with assembly joints. In some implementations, portions of the perimeter may not be affixed in any manner, but instead may rely on adjacent securing portions.

The first assembly portion may be attached to the computing device housing in any suitable way. For example, the first assembly portion may be glued to the device housing via a suitable adhesive, welded to the device housing, affixed using one or more fasteners or fastening mechanisms (e.g., screws, bolts, rivets, brackets, clamps), etc. In some implementations, the platform and plurality of assembly joints of the first assembly portion may be integrally formed with the computing device housing, meaning they are each formed from the same piece of material. In such cases, the computing device housing and first assembly portion may be collectively referred to as a device housing portion.

Figure 4:
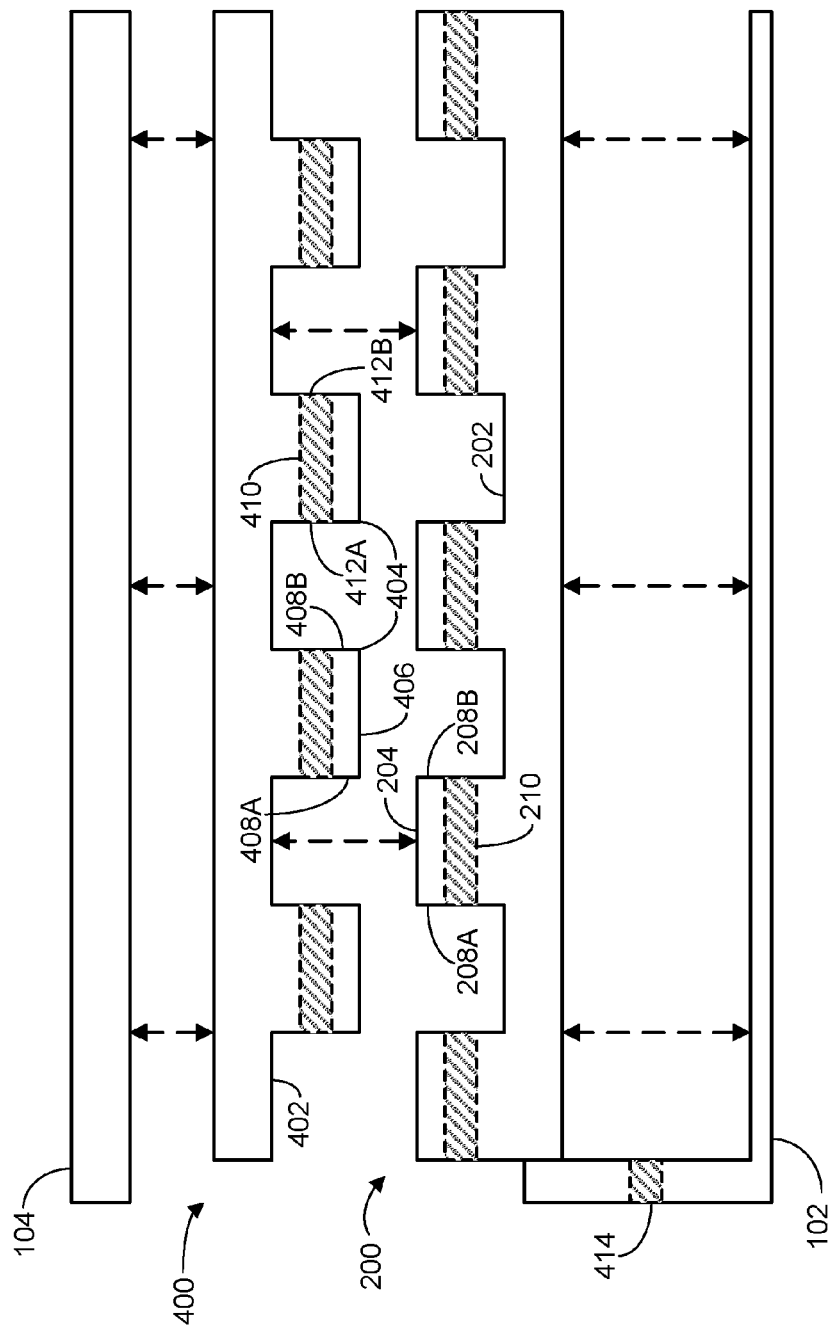
FIG. 4 schematically shows a computing display, computing device housing, and first and second assembly portions.

As indicated above, the computing device housing and computing display may each be attached to or otherwise incorporate an assembly portion of a cable-retention device assembly. Accordingly, computing display 104 of computing device 100 may be attached to a second assembly portion substantially similar to first assembly portion 200. A portion of an example second assembly portion 400 is schematically shown in FIG. 4. FIG. 4 also shows computing device housing 102, computing display 104, and first assembly portion 200. Components in FIG. 4 are shown in cross section, allowing the tunnels of each assembly joint to be seen.

Second assembly portion includes a platform 402 and a plurality of assembly joints 404 extending from the platform. As with the first assembly portion, each assembly joint of the second assembly portion includes a nose 406 forming a terminal end of the assembly joint, first and second interfacing sides 408A and 408B extending from the platform to the nose, and a tunnel 410 running from the first interfacing side to the second interfacing side. Each tunnel 410 has a first tunnel opening 412A in its first interfacing side 408A and a second tunnel opening 412B in its second interfacing side 408B. Also visible in FIG. 4 is a cable access port 414 of computing device housing 102, through which a cable can be inserted into or removed from a cable-routing channel, as will be described below. Though cable access port 414 is shown in a particular location on the computing device housing, it will be understood that a cable access port may be situated in any suitable position on a computing device.

As with the first assembly portion, the second assembly portion may be affixed to the computing display in any suitable manner, for example utilizing adhesive, screws, bolts, rivets, brackets, clamps, etc. In other cases, the second assembly portion may be integrally formed with the computing display, or a portion thereof, in which case the computing display and second assembly portion may be collectively referred to as a computing display portion. Furthermore, the second assembly portion may in some cases not run along all four sides of the computing display, though generally will run along one or more sides of the computing display. Any sides of the computing display that do not include assembly joints may be affixed to the computing device housing in another suitable fashion.

Though FIG. 4 shows the first and second assembly portions as being separate from the computing device housing and computing display, this is only intended to illustrate how the various components fit together, and is not intended to limit how the device may be assembled. As indicated above, either or both the first and second assembly portions may be integrally formed with the computing device housing and computing display respectively. Furthermore, the first and second assembly portions may be attached to the computing device housing and computing display at any time during initial assembly of the device, either before or after the first and second assembly portions are attached to one another. It will be understood that the various components may be assembled in any order and be affixed to one another in any suitable way.

As indicated above, the assembly joints of the first assembly portion are sized and shaped to cooperatively interface with assembly joints of the second assembly portion. This allows the first and second assembly portions to be releasably mated together.

Once the first assembly portion is mated to the second assembly portion, tunnels of each plurality of assembly joints collectively define a cable-routing channel. A cable may be routed through the cable-routing channel to securely affix the first assembly portion to the second assembly portion. Together, the cable, first assembly portion, and second assembly portion collectively comprise a cable-retention device assembly 500, schematically shown in FIGS. 5A and 5B. In FIG. 5A, the first and second assembly portions have been mated together, and a cable 502 has been partially inserted into a cable-routing channel 504 defined by tunnels of each of the assembly joints of first assembly portion 200 and second assembly portion 400. The cable may be inserted via cable access port 414 of the computing device housing.

FIG. 5A also schematically shows a cross section of cable 502, which includes a flexible steel cable 506 and a plastic jacket 508. Constructing the cable from these materials may ensure that the cable is suitably flexible to be inserted into and removed from the cable-routing channel, while remaining durable enough for repeated and extended use without breaking or deforming. However, it will be understood that the cable may take on a variety of suitable forms and be constructed from a variety of suitable materials, and the specific cable shown in FIG. 5A is not intended to limit the present disclosure. For example, in a scenario where the cable need not be routed around any corners, less flexible or entirely rigid cables could be used, such that the cable comprises a rigid rod or pin.

In FIG. 5B, cable 502 has been fully inserted into the cable-routing channel. Once inserted into the cable-routing channel, the cable prevents separation between the first assembly portion and the second assembly portion. In this manner, the second assembly portion is releasably mated to the first assembly portion, thereby releasably securing the computing display to the computing device housing. Should disassembly of the computing device be required, the cable is removable from cable-retention device assembly 500 via cable access port 414, and removal of the cable allows separation of the first assembly portion from the second assembly portion.

Cable 502 may also be attached to a cap 510 at one end. As the cable is removable from the cable-retention device assembly via the cable access port, cap 510 may cover the cable access port. This may serve to prevent water or debris from entering the cable routing channel, for example, and/or facilitate removal of the cable from the cable-retention device assembly.

In order to prevent accidental removal of the cable, the cable access port may optionally be secured in a number of ways. In some cases, the cable access port may be hidden from view or easy access. For example, the cable access port may be disposed behind a removable cover, a warning label, and/or a speaker grille of the computing device, among other options. In this manner, the cable access port is sufficiently accessible to users or technicians to facilitate intentional disassembly of the computing device, while sufficiently secured to prevent unintentional disassembly of the computing device.

The process of removing the cable from the cable-retention device assembly is schematically illustrated in FIGS. 6A-6D. FIGS. 6A-6D are merely intended to visually illustrate an example process of cable removal, and are not intended to limit this disclosure to any particular device or method of disassembly.

Figure 6D:
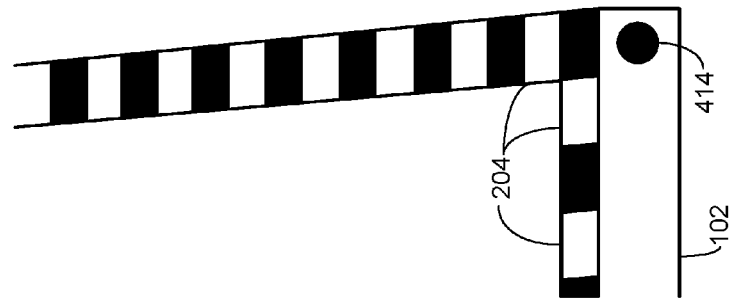
FIGS. 6A-6D schematically show removal of a cable from a cable-retention device assembly.
Figure 6C:
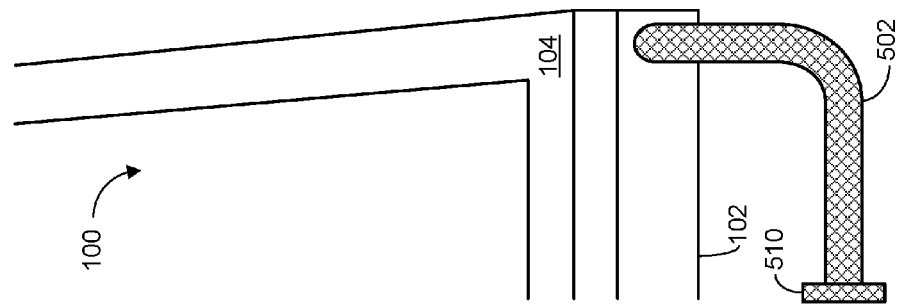
Figure 6B:
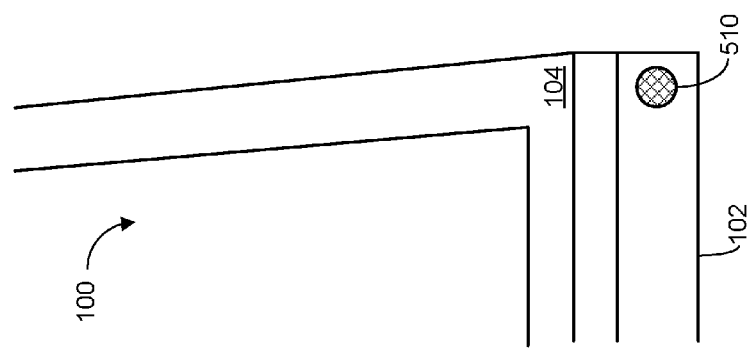
Figure 6A:
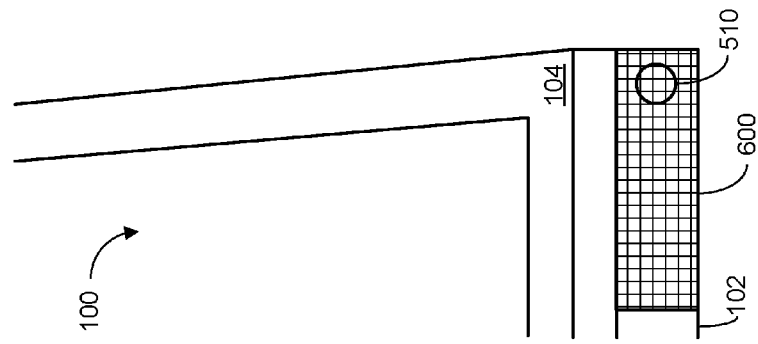

FIG. 6A shows computing device 100 while still assembled, including computing device housing 102 and computing display 104. In FIG. 6A, a speaker grille 600 is attached to computing device housing 102 and covers cap 510 of cable 502. It will be understood that speaker grilles may have any suitable size and shape, and need not be included in a device incorporating a cable-retention device assembly as described herein.

In FIG. 6B, speaker grille 600 has been removed, allowing access to cap 510. As with speaker grille 600, it will be understood that a cable need not be attached to a cap, and cap 510 is provided only for the sake of example.

In FIG. 6C, cap 510 has been pulled away from computing device 100, exposing a portion of cable 502. Complete removal of the cable from the computing device allows for separation of the first assembly portion from the second assembly portion, thereby allowing the computing display to be removed from the computing device housing. This is shown in FIG. 6D, in which cable 502 has been completely removed, exposing cable access port 414. Further, FIG. 6D shows computing display 104 removed from the computing device housing.

Though the above description focused on using a single cable to affix a computing display to a computing device housing, it will be understood that any number of cables may be used to secure a cable-retention device assembly as described herein. In other words, the cable shown in FIGS. 5A and 5B may be one of plural cables routed through plural cable-routing channels. In such cases, removal of each of the plural cables allows separation of the first assembly portion from the second assembly portion.

Figure 7:
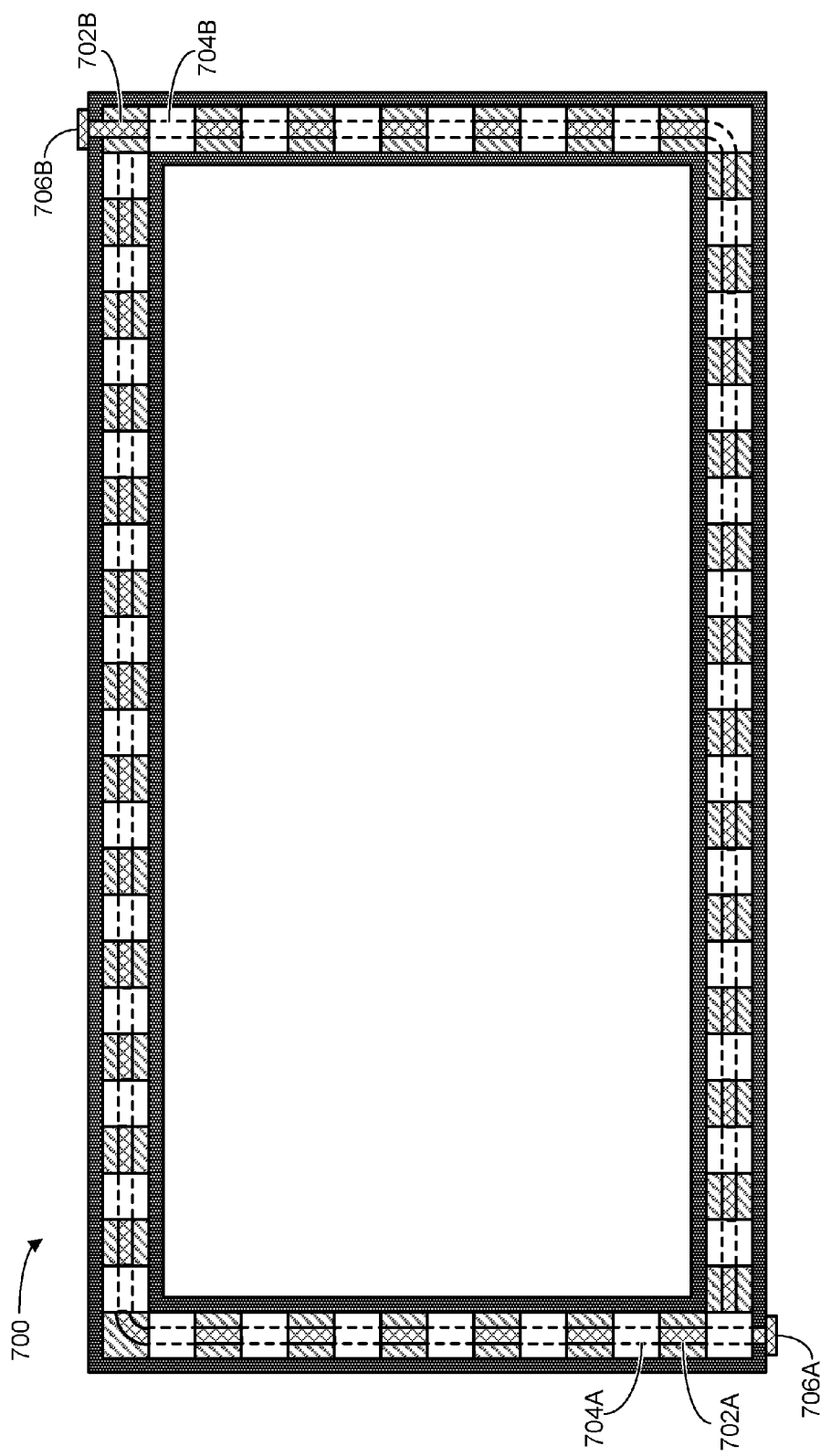
FIG. 7 schematically shows plural cables routed through assembly joints of a first assembly portion.

FIG. 7 schematically shows an example of a computing device housing 700 with no computing display currently attached. Nevertheless, two different cables 702A and 702B have been routed through separate cable-routing channels 704A and 704B. Each cable 702 is accessible via separate cable access ports 706A and 706B. Using multiple cables may improve the ease with which cables are routed through the cable-routing channel during device assembly, as the number of curves and bends through which each cable must be routed is reduced. It will be understood that while two different cables are shown in FIG. 7, a cable-retention device assembly may incorporate any suitable number of cables.

In an example, a cable-retention device assembly comprises: a first assembly portion; a second assembly portion; where each of the first assembly portion and the second assembly portion include a platform and a plurality of assembly joints extending from the platform, and each assembly joint comprises: a nose forming a terminal end of the assembly joint; first and second interfacing sides extending from the platform to the nose; and a tunnel running through the assembly joint from the first interfacing side to the second interfacing side, each of the first and second interfacing sides defining an opening to the tunnel; where assembly joints of the first assembly portion are sized and shaped to cooperatively interface with assembly joints of the second assembly portion, such that tunnels of each plurality of assembly joints collectively define a cable-routing channel when the first assembly portion is mated to the second assembly portion; and a cable routable through the cable-routing channel to prevent separation between the first assembly portion and the second assembly portion. In this example or any other example, the first and second interfacing sides of each assembly joint are parallel to one another and perpendicular to the platform. In this example or any other example, the nose of each assembly joint is perpendicular to the first and second interfacing sides and parallel to the platform. In this example or any other example, the nose of each assembly joint has four sides, and each corner of the nose defines a right angle. In this example or any other example, the first and second interfacing sides of each assembly joint are angled such that the assembly joint tapers from the platform to the nose. In this example or any other example, removal of the cable allows separation of the first assembly portion from the second assembly portion. In this example or any other example, the cable is removable from the cable-retention device assembly via a cable access port. In this example or any other example, the cable access port is covered by a cap attached to the cable. In this example or any other example, the cable access port is covered by a speaker grille. In this example or any other example, the cable is one of plural cables routed through plural cable-routing channels. In this example or any other example, the first assembly portion is affixed to a computing device housing. In this example or any other example, the cable includes a rigid rod or pin. In this example or any other example, the cable includes a flexible steel cable and a plastic jacket.

In an example, a cable-retention device assembly comprises: a device housing portion; a computing display portion; where each of the device housing portion and the computing display portion include, along one or more sides of the device housing portion and the computing display portion, a platform and a plurality of assembly joints extending from the platform, and each assembly joint comprises: a nose forming a terminal end of the assembly joint; first and second interfacing sides extending from the platform to the nose; and a tunnel running through the assembly joint from the first interfacing side to the second interfacing side, each of the first and second interfacing sides defining an opening to the tunnel; where assembly joints of the device housing portion are sized and shaped to cooperatively interface with assembly joints of the computing display portion, such that tunnels of each plurality of assembly joints collectively define a cable-routing channel when the device housing portion is mated to the computing display portion; and a cable routable through the cable-routing channel to prevent separation between the device housing portion and the computing display portion. In this example or any other example, the first and second interfacing sides of each assembly joint are parallel to one another and perpendicular to the platform. In this example or any other example, the first and second interfacing sides of each assembly joint are angled such that the assembly joint tapers from the platform to the nose. In this example or any other example, removal of the cable allows separation of the device housing portion from the computing display portion. In this example or any other example, the cable is one of plural cables routed through plural cable-routing channels. In this example or any other example, the cable includes a flexible steel cable and a plastic jacket.

In an example, a computing device comprises: a computing device housing affixed to a first assembly portion, the computing device housing including one or more computer processing components; a computing display affixed to a second assembly portion, the second assembly portion releasably mated to the first assembly portion, thereby releasably securing the computing display to the computing device housing; where each of the first assembly portion and the second assembly portion include a platform and a plurality of assembly joints extending from the platform, and each assembly joint comprises: a nose forming a terminal end of the assembly joint; first and second interfacing sides extending from the platform to the nose, the first and second interfacing sides running parallel to one another and perpendicular to the nose; and a tunnel running through the assembly joint from the first interfacing side to the second interfacing side, each of the first and second interfacing sides defining an opening to the tunnel; where assembly joints of the first assembly portion are sized and shaped to cooperatively interface with assembly joints of the second assembly portion, such that tunnels of each plurality of assembly joints collectively define a cable-routing channel when the first assembly portion is mated to the second assembly portion; and a cable routable through the cable-routing channel to prevent removal of the computing display from the computing device housing, where removal of the cable from the cable-routing channel allows removal of the computing display from the computing device housing.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A cable-retention device assembly, comprising:
a first assembly portion;
a second assembly portion;
where each of the first assembly portion and the second assembly portion include a platform and a plurality of assembly joints extending from the platform, and each assembly joint comprises:
a nose forming a terminal end of the assembly joint;
first and second interfacing sides extending from the platform to the nose; and
a tunnel running through the assembly joint from the first interfacing side to the second interfacing side, each of the first and second interfacing sides defining an opening to the tunnel;
where assembly joints of the first assembly portion are sized and shaped to cooperatively interface with assembly joints of the second assembly portion, such that tunnels of each plurality of assembly joints collectively define a cable-routing channel when the first assembly portion is mated to the second assembly portion; and
a cable routable through the cable-routing channel to prevent separation between the first assembly portion and the second assembly portion, where the cable is removable from the cable-retention device assembly via a cable access port covered by a speaker grille.

2. The cable-retention device assembly of claim 1, where the first and second interfacing sides of each assembly joint are parallel to one another and perpendicular to the platform.

3. The cable-retention device assembly of claim 1, where the nose of each assembly joint is perpendicular to the first and second interfacing sides and parallel to the platform.

4. The cable-retention device assembly of claim 1, where the nose of each assembly joint has four sides, and each corner of the nose defines a right angle.

5. The cable-retention device assembly of claim 1, where the first and second interfacing sides of each assembly joint are angled such that the assembly joint tapers from the platform to the nose.

6. The cable-retention device assembly of claim 1, where removal of the cable allows separation of the first assembly portion from the second assembly portion.

7. The cable-retention device assembly of claim 1, where the speaker grille is attached to the cable.

8. The cable-retention device assembly of claim 1, where the cable is one of plural cables routed through plural cable-routing channels.

9. The cable-retention device assembly of claim 1, where the first assembly portion is affixed to a computing device housing.

10. The cable-retention device assembly of claim 1, where the cable includes a rigid rod or pin.

11. The cable-retention device assembly of claim 1, where the cable includes a flexible steel cable and a plastic jacket.

12. A cable-retention device assembly, comprising:
a device housing portion;
a computing display portion;
where each of the device housing portion and the computing display portion include, along one or more sides of the device housing portion and the computing display portion, a platform and a plurality of assembly joints extending from the platform, and each assembly joint comprises:
a nose forming a terminal end of the assembly joint;
first and second interfacing sides extending from the platform to the nose; and
a tunnel running through the assembly joint from the first interfacing side to the second interfacing side, each of the first and second interfacing sides defining an opening to the tunnel;
where assembly joints of the device housing portion are sized and shaped to cooperatively interface with assembly joints of the computing display portion, such that tunnels of each plurality of assembly joints collectively define a cable-routing channel when the device housing portion is mated to the computing display portion; and
a cable routable through the cable-routing channel to prevent separation between the device housing portion and the computing display portion, where the cable is removable from the cable-retention device via a cable access port covered by a speaker grille.

13. The cable-retention device assembly of claim 12, where the first and second interfacing sides of each assembly joint are parallel to one another and perpendicular to the platform.

14. The cable-retention device assembly of claim 12, where the first and second interfacing sides of each assembly joint are angled such that the assembly joint tapers from the platform to the nose.

15. The cable-retention device assembly of claim 12, where removal of the cable allows separation of the device housing portion from the computing display portion.

16. The cable-retention device assembly of claim 12, where the cable is one of plural cables routed through plural cable-routing channels.

17. The cable-retention device assembly of claim 12, where the cable includes a flexible steel cable and a plastic jacket.

18. A computing device, comprising:
- a computing device housing affixed to a first assembly portion, the computing device housing including one or more computer processing components;
- a computing display affixed to a second assembly portion, the second assembly portion releasably mated to the first assembly portion, thereby releasably securing the computing display to the computing device housing;
  - where each of the first assembly portion and the second assembly portion include a platform and a plurality of assembly joints extending from the platform, and each assembly joint comprises:
    - a nose forming a terminal end of the assembly joint;
    - first and second interfacing sides extending from the platform to the nose, the first and second interfacing sides running parallel to one another and perpendicular to the nose; and
    - a tunnel running through the assembly joint from the first interfacing side to the second interfacing side, each of the first and second interfacing sides defining an opening to the tunnel;
  - where assembly joints of the first assembly portion are sized and shaped to cooperatively interface with assembly joints of the second assembly portion, such that tunnels of each plurality of assembly joints collectively define a cable-routing channel when the first assembly portion is mated to the second assembly portion; and
- a cable routable through the cable-routing channel to prevent removal of the computing display from the computing device housing, where removal of the cable from the cable-routing channel allows removal of the computing display from the computing device housing via a cable access port covered by a speaker grille.

\* \* \* \* \*